US011947267B2

(12) United States Patent
Shigenobu et al.

(10) Patent No.: US 11,947,267 B2
(45) Date of Patent: Apr. 2, 2024

(54) METHOD OF OBTAINING ARRAY OF PLURALITY OF SHOT REGIONS ON SUBSTRATE, EXPOSURE METHOD, EXPOSURE APPARATUS, METHOD OF MANUFACTURING ARTICLE, NON-TRANSITORY COMPUTER-READABLE STORAGE MEDIUM, AND INFORMATION PROCESSING APPARATUS

(71) Applicant: CANON KABUSHIKI KAISHA, Tokyo (JP)

(72) Inventors: Atsushi Shigenobu, Tochigi (JP); Fuma Kizu, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/952,380

(22) Filed: Sep. 26, 2022

(65) Prior Publication Data

US 2023/0108056 A1    Apr. 6, 2023

(30) Foreign Application Priority Data

Oct. 1, 2021  (JP) .................................. 2021-163069

(51) Int. Cl.
*G03F 7/00*    (2006.01)
(52) U.S. Cl.
CPC .................................... *G03F 7/705* (2013.01)
(58) Field of Classification Search
CPC ....... G03F 7/705; G03F 9/7003; G03F 9/7092
See application file for complete search history.

(56) References Cited

U.S. PATENT DOCUMENTS

| | | | |
|---|---|---|---|
| 8,117,001 B2* | 2/2012 | Lee ........................ | G03F 7/705 702/83 |
| 9,087,176 B1* | 7/2015 | Chang ...................... | G03F 1/36 |
| 10,295,993 B2* | 5/2019 | Choi ...................... | G05B 13/04 |
| 2017/0023358 A1* | 1/2017 | Lee ..................... | G03F 7/70683 |
| 2018/0330999 A1* | 11/2018 | Lee ........................... | G03F 1/36 |
| 2020/0006102 A1* | 1/2020 | Lin ..................... | G03F 7/70633 |
| 2020/0124975 A1* | 4/2020 | Lee ..................... | G03F 7/70883 |
| 2020/0363734 A1* | 11/2020 | Shigenobu .......... | G03F 7/70783 |
| 2021/0011373 A1* | 1/2021 | Lee ......................... | G03F 7/2004 |
| 2022/0100108 A1* | 3/2022 | Egashira ............... | G03F 9/7088 |
| 2022/0269187 A1* | 8/2022 | Shigenobu ............ | G03F 9/7011 |

FOREIGN PATENT DOCUMENTS

| | | |
|---|---|---|
| JP | S61-044429 A | 3/1986 |
| JP | S62-084516 A | 4/1987 |
| JP | H06-349705 A | 12/1994 |
| JP | 3230271 B2 | 11/2001 |

* cited by examiner

*Primary Examiner* — Deoram Persaud
(74) *Attorney, Agent, or Firm* — Carter, DeLuca & Farrell LLP (57) ABSTRACT

A method including calculating, using an objective function, which includes a regression model used to estimate an array of a plurality of regions on a substrate and a regularization term used to limit a value of a coefficient of the regression model, a value of each of a plurality of coefficients included in the regression model, with which the objective function becomes not more than a reference value, extracting, based on the calculated values, the coefficient having the value not less than a threshold value from the plurality of coefficients, and obtaining, using a regression model including only the extracted coefficient, an array of a plurality of regions on a substrate.

13 Claims, 7 Drawing Sheets

FIG. 6A    L1 NORM

FIG. 6B    L2 NORM

METHOD OF OBTAINING ARRAY OF PLURALITY OF SHOT REGIONS ON SUBSTRATE, EXPOSURE METHOD, EXPOSURE APPARATUS, METHOD OF MANUFACTURING ARTICLE, NON-TRANSITORY COMPUTER-READABLE STORAGE MEDIUM, AND INFORMATION PROCESSING APPARATUS

BACKGROUND OF THE INVENTION

Field of the Invention

The present invention relates to a method of obtaining an array of a plurality of shot regions on a substrate, an exposure method, an exposure apparatus, a method of manufacturing an article, a non-transitory computer-readable storage medium, and an information processing apparatus.

Description of the Related Art

An exposure apparatus overlays 10 or more layers of patterns (circuit patterns) and transfers these to a substrate. If the overlay accuracy of the patterns between the layers is not high, inconvenience may occur in the circuit characteristic. In this case, a chip cannot satisfy a predetermined characteristic and becomes defective, resulting in a low yield. It is therefore necessary to accurately position (align) each of the plurality of regions to be exposed and the pattern of an original on the substrate.

In the exposure apparatus, an alignment mark arranged in each region on the substrate is detected, and each region on the substrate is aligned with the pattern of the original based on the position information of the alignment mark and the position information of the pattern of the original. Ideally, when alignment mark detection is performed for all regions on the substrate, most accurate alignment can be performed. However, this is not realistic from the viewpoint of productivity. To cope with this, the current mainstream of an alignment method for a substrate and an original is a global alignment method as disclosed in Japanese Patent Laid-Open No. 61-44429 or 62-84516.

In the global alignment method, assuming that the relative position of each region on a substrate can be expressed by a function model of the position coordinates of the region, the positions of alignment marks arranged only in a plurality of (4 to 16) sample regions on the substrate are measured. Next, the parameters of the function model are estimated, using regression analysis-like statistic operation processing, from the assumed function model and the measurement result of the alignment mark positions. Using the parameter and the function model, the position coordinates of each region on a stage coordinate system (the array of the regions on the substrate) are calculated, thereby performing alignment. As disclosed in Japanese Patent Laid-Open No. 6-349705, in the global alignment method, a polynomial model using stage coordinates as variables is used in general, and scaling that is a first-order polynomial of stage coordinates, rotation, uniform offset, and the like are mainly used. A technique using a regression model that considers, as a parameter, even a high-order component of the array of regions on the substrate is also proposed in Japanese Patent No. 3230271.

Along with the progress of miniaturization and integration of devices, the alignment accuracy is required to be improved. For this reason, the degree of freedom of the function model needs to be increased by using a higher-order component as the degree of the polynomial of the function model. However, if the number of measurement points to measure the positions of alignment marks in a substrate is small relative to the degree of freedom of the function model, overfitting occurs, and correction errors of unmeasured regions increase. On the other hand, if the number of measurement points to measure the positions of alignment marks is increased to suppress the overfitting, the measurement time increases, and the productivity lowers. Since these have a tradeoff relationship, there is demanded a technique capable of accurately predicting the array of regions on a substrate including a high-order component using a small number of measurement points and a function model of a high degree of freedom.

SUMMARY OF THE INVENTION

The present invention provides a technique advantageous in accurately obtaining the array of regions on a substrate.

According to one aspect of the present invention, there is provided a method of obtaining an array of a plurality of regions on a substrate, including calculating, using an objective function, which includes a regression model used to estimate the array and a regularization term used to limit a value of a coefficient of the regression model, and position measurement data of a mark assigned to a sample region among a plurality of regions on a first substrate, a value of each of a plurality of coefficients included in the regression model, with which the objective function becomes not more than a reference value, extracting, based on the values calculated in the calculating, the coefficient having the value not less than a threshold value from the plurality of coefficients, and obtaining, using a regression model including only the coefficient extracted in the extracting and position measurement data of a mark assigned to a sample region among a plurality of regions on a second substrate, an array of the plurality of regions on the second substrate.

Further aspects of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1:
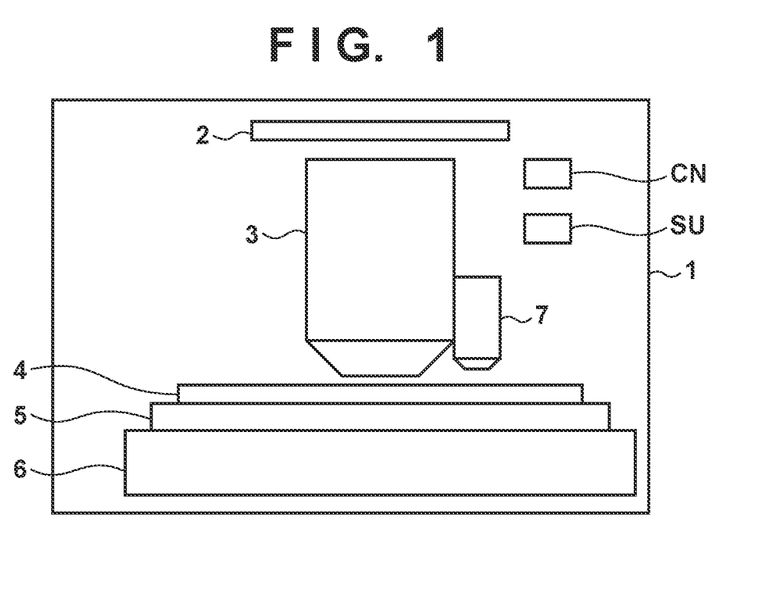
FIG. 1 is a schematic view illustrating configurations of an exposure apparatus according to an aspect of the present invention.

FIG. 1 is a schematic view illustrating configurations of an exposure apparatus 1 according to an aspect of the present invention. The exposure apparatus 1 is a lithography apparatus used in the manufacturing process of a device such as a semiconductor element. In this embodiment, the exposure apparatus 1 projects the pattern of an original 2 (a reticle or a mask) onto a substrate 4 via a projection optical system 3, and exposes the substrate 4.

As shown in FIG. 1, the exposure apparatus 1 includes the projection optical system 3 that projects (reduction-projects) a pattern formed on the original 2, and a chuck 5 that holds the substrate 4 on which a base pattern or an alignment mark is formed by a preprocess. The exposure apparatus 1 also includes a substrate stage 6 that holds the chuck 5 and positions the substrate 4 at a predetermined position, an alignment optical system 7 that measures the position of an alignment mark provided on the substrate 4, a control unit CN, and a storage unit SU.

The control unit CN is formed by, for example, a computer (information processing apparatus) including a CPU, a memory, and the like, and generally controls the units of the exposure apparatus 1 in accordance with a program stored in the storage unit SU or the like. In this embodiment, in addition to controlling exposure processing of exposing the substrate 4 via the original 2, the control unit CN functions as a processing unit configured to obtain an array (a shot array or a region array) of a plurality of shot regions on the substrate (a plurality of regions on the substrate).

The storage unit SU stores a program and various kinds of information (data) necessary to execute exposure processing of exposing the substrate 4 by controlling the units of the exposure apparatus 1. The storage unit SU also stores a program and various kinds of information (data) necessary for the control unit CN to obtain a shot array.

Figure 2:
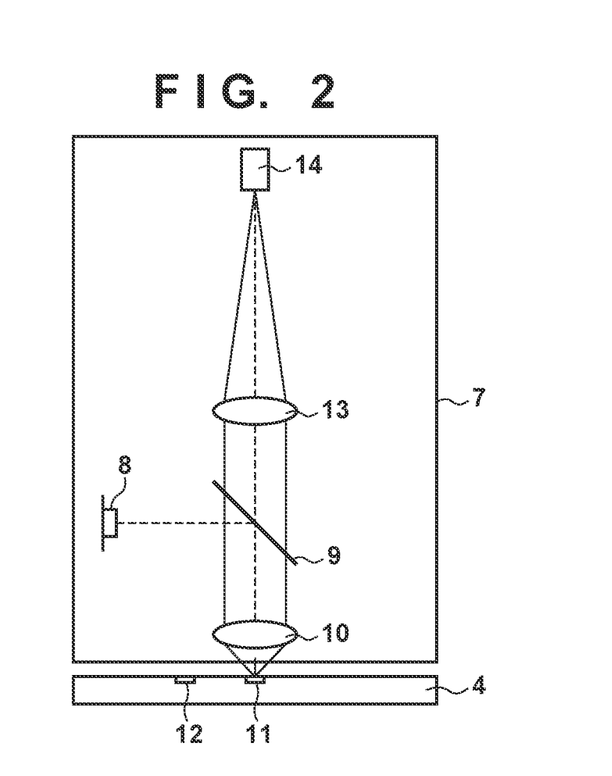
FIG. 2 is a schematic view illustrating configurations of the alignment optical system of the exposure apparatus shown in FIG. 1.

FIG. 2 is a schematic view illustrating configurations of the alignment optical system 7. The alignment optical system 7 has a function of optically detecting a mark assigned to each shot region on the substrate 4 and acquiring position measurement data, and, in this embodiment, includes a light source 8, a beam splitter 9, lenses 10 and 13, and a sensor 14.

Light from the light source 8 is reflected by the beam splitter 9 and illuminates, via the lens 10, an alignment mark 11 or 12 provided on the substrate 4. The light diffracted by the alignment mark 11 or 12 is received by the sensor 14 via the lens 10, the beam splitter 9, and the lens 13.

Figure 3:
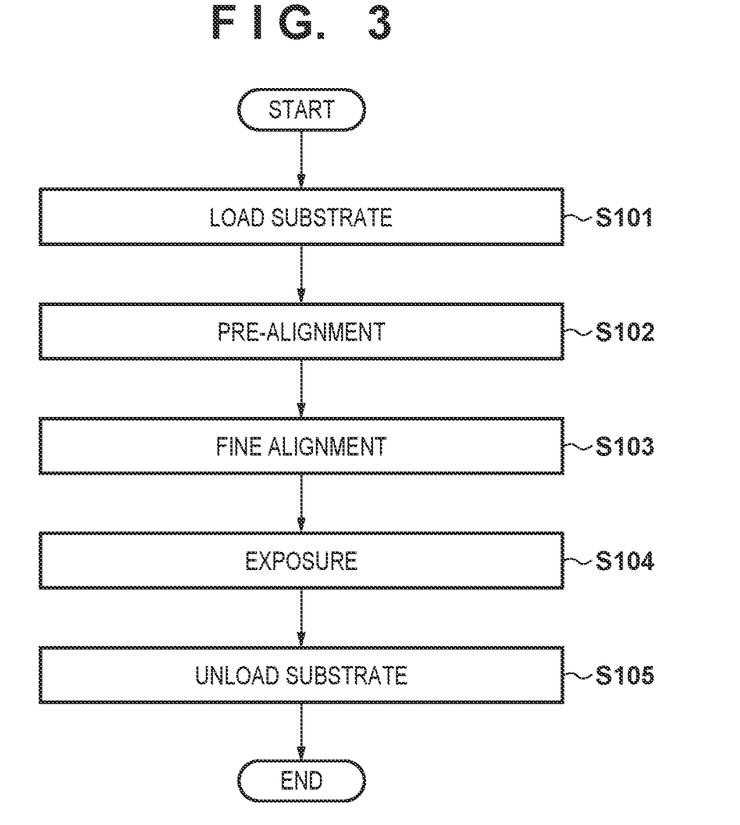
FIG. 3 is a flowchart for explaining exposure processing of the exposure apparatus shown in FIG. 1.

Exposure processing by the exposure apparatus 1 will be described with reference to FIG. 3. The outline of processes until the substrate 4 is aligned and exposed will be described here. In step S101, the substrate 4 is loaded into the exposure apparatus 1. In step S102, pre-alignment is executed. More specifically, the alignment mark 11 for pre-alignment provided on the substrate 4 is detected by the alignment optical system 7, thereby roughly obtaining the position of the substrate 4. At this time, detection of the alignment mark 11 is performed for a plurality of shot regions on the substrate 4, and the shift and the first-order linear component (magnification or rotation) of the entire substrate 4 are obtained.

In step S103, fine alignment is executed. More specifically, first, based on the result of pre-alignment, the substrate stage 6 is driven to a position where the alignment mark 12 for fine alignment provided on the substrate 4 can be detected by the alignment optical system 7. Then, the alignment mark 12 provided in each of the plurality of shot regions on the substrate 4 is detected by the alignment optical system 7, thereby accurately obtaining the shift and the first-order linear component (magnification or rotation) of the entire substrate 4. At this time, the high-order deformation component of the substrate 4 can accurately be obtained by obtaining the positions of a number of shot regions. This makes it possible to obtain the accurate position of each shot region on the substrate 4, that is, the shot array.

In step S104, the substrate 4 is exposed. More specifically, after the fine alignment is executed, the pattern of the original 2 is transferred to each shot region on the substrate 4 via the projection optical system 3. In step S105, the substrate 4 is unloaded from the exposure apparatus 1.

In this embodiment, if a distortion occurs in the substrate 4, the high-order deformation component is corrected in the fine alignment of step S103. As a regression model used to estimate the shot array, a cubic polynomial model will be described as an example. However, the present invention is not limited to this. For example, as the regression model, an arbitrary degree model may be used, or a model (a triangle function model or a logarithmic model) other than a polynomial may be used.

If the deformation of the substrate 4 is expressed by a cubic polynomial model, the position deviations (ShiftX, ShiftY) of each shot region are represented by equations (1) below. Note that a position deviation of each shot region can also be considered as a correction value used to correct the position deviation.

$$ShiftX = \\ k_1 + k_3 x + k_5 y + k_7 x^2 + k_9 xy + k_{11} y^2 + k_{13} x^3 + k_{15} x^2 y + k_{17} xy^2 + k_{19} y^3 \\ ShiftY = \\ k_2 + k_4 y + k_6 x + k_8 y^2 + k_{10} xy + k_{12} x^2 + k_{14} y^3 + k_{16} xy^2 + k_{18} x^2 y + k_{20} x^3 \tag{1}$$

where x and y are the positions of a shot region on the substrate 4. Coefficients $k_1$ to $k_{20}$ in equations (1) are decided from the actual position measurement data of each shot region on the substrate 4. Then, the position deviation of each shot region is obtained based on equations (1) in which the coefficients are decided.

Figure 4:
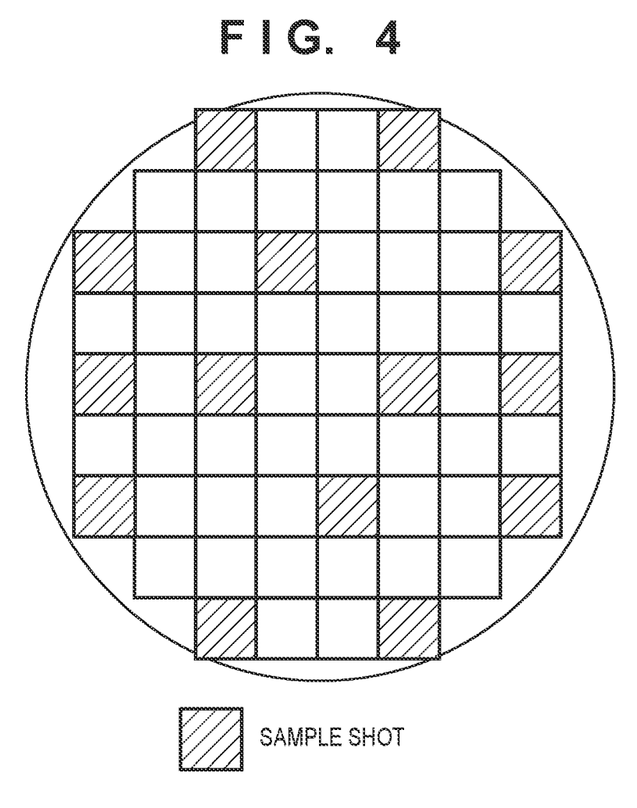
FIG. 4 is a view showing the array of shot regions on a substrate.

To obtain the position measurement data, for example, as shown in FIG. 4, the alignment optical system 7 detects alignment marks 12 assigned to some shot regions, that is, so-called sample shot regions (sample regions) of a plurality of shot regions on the substrate. In FIG. 4, the number of sample shot regions is 14. To correct the high-order deformation component of the substrate 4, a lot of shot regions need to be set to sample shot regions. However, an increase in the number of sample shot regions and the measurement time (alignment time) have a tradeoff relationship. Hence, in fact, the number of sample shot regions is decided in consideration of the productivity of devices.

Figure 5:
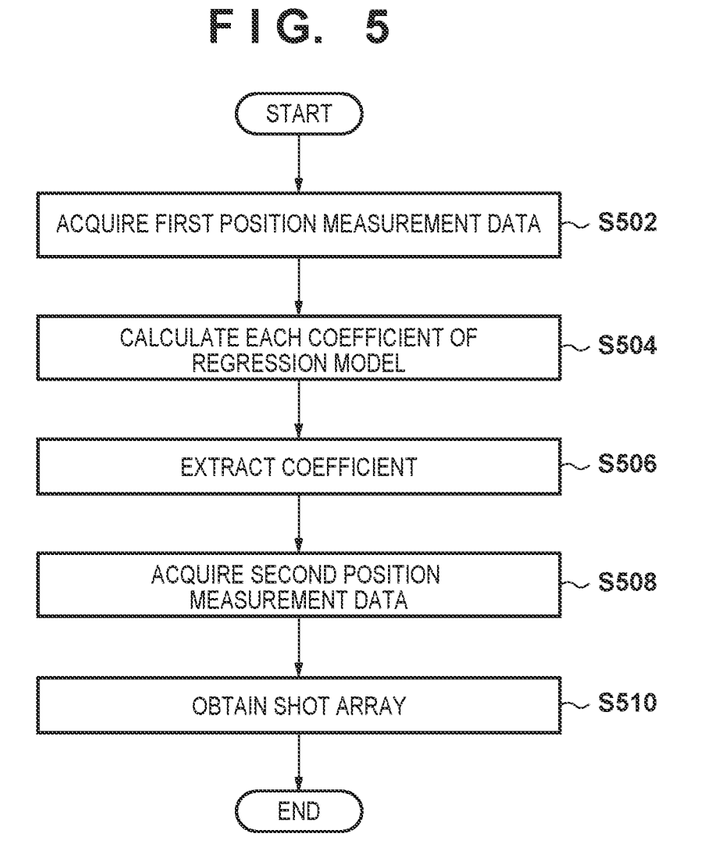
FIG. 5 is a flowchart for explaining processing of optimizing a regression model used to estimate the shot array on the substrate and obtaining the shot array.

Processing of optimizing a regression model used to estimate the shot array on the substrate and obtaining the shot array using the regression model in this embodiment will described below with reference to FIG. 5. Note that it is assumed in this embodiment that, in this processing, optimization of the regression model used to estimate the shot array on the substrate is performed by the control unit CN, but the optimization may be performed in an external information processing apparatus.

In step S502, a test substrate (first substrate) is used to acquire the first position measurement data. More specifically, the number of sample shot regions for the test substrate is set to a number which does not cause overfitting relative to the degree of freedom of the function model and is sufficient relative to the degree of freedom of the model. Then, the alignment mark assigned to each sample shot region on the test substrate is detected by the alignment optical system 7 to acquire the first position measurement data.

In step S504, coefficients of the regression model used to estimate the shot array are calculated (first step). More specifically, by using the first position measurement data acquired in step S502 and a regularized regression model, the value of each of a plurality of coefficients included in the regression model used to estimate the shot array, with which the regularized regression model becomes equal to or smaller than a reference value, for example, the regularized regression model is minimized, are calculated. Here, the regularized regression model is a function (objective function) including the regression model used to estimate the shot array and a regularization term for limiting the values of the coefficients of the regression model.

In step S506, based on the values of the coefficients of the regression model calculated in step S504, the coefficient having a value equal to or larger than a preset threshold value is extracted (selected) from the plurality of coefficients included in the regression model (second step). Note that as the threshold value, the same (common) threshold value may be set for all the coefficients included in the regression model, or a threshold value may be set for each of the plurality of coefficients included in the regression model.

In step S508, the second position measurement data is acquired using the substrate 4 (second substrate) as a substrate to be actually exposed. More specifically, the number of sample shot regions for the substrate 4 is set to be smaller than the number of sample shot regions set for the test substrate. Then, the alignment mark 12 assigned to each sample shot region on the substrate 4 is detected by the alignment optical system 7 to acquire the second position measurement data.

In step S510, the shot array (the array of the plurality of shot regions) on the substrate 4 is obtained (third step). More specifically, by using the regression model including only the coefficients extracted in step S506 and the second position measurement data acquired in step S508, the shot array of the substrate 4 (that is, the position deviation of each shot region on the substrate 4) is obtained. Here, the regression model including only the coefficients extracted in step S506 includes only important coefficients (models corresponding thereto) with unnecessary coefficients (models corresponding thereto) removed by regularized regression. Therefore, overfitting can be suppressed even with the small number of the sample shot regions (measurement points) set for the substrate 4.

As has been described above, according to this embodiment, overfitting can be suppressed and the shot array on the substrate 4 can be obtained with high accuracy while using a small number of measurement points and a function model of a high degree of freedom. Hence, the high-order deformation component can be corrected. Note that in this embodiment, the test substrate is used in step S502, but the substrate 4 as the substrate to be actually exposed may be used in place of the test substrate. In other words, instead of using different substrates in steps S502 and S508, the same substrate (the substrate to be actually exposed) may be used in steps S502 and S508.

The regularized regression model in this embodiment will be more specifically described below. First, as a comparative example, a general regression model including no regularization term, that is, without regularization, and its problem will be described.

As a simple example, assume a regression model up to the second order of the substrate coordinates. In order to obtain optimal coefficients $(k_1, k_3, k_5, k_7, k_9, k_{11})$ of the regression model, as represented by equations (2) below, the sum of the differences, each of which is the difference between position measurement data Yi and a predicted value Ti from the regression model, at all the data points is calculated. Note that in equations (2), i is an integer between 1 and n, and n is the number of data points:

$$\Sigma_{i=1}^{n}(Y_i-T_i)^2 * T_i = k_1 + k_3 x_i + k_5 y_i + k_7 x_i^2 + k_9 x_i y_i + k_{11} y_i^2 \qquad (2)$$

Equations (2) are generally called a loss function. Optimization of each coefficient of a general regression model without regularization can be replaced with an optimization problem of minimizing, as an objective function, the loss function including the above-described coefficients $k_1$ to $k_{11}$. However, in such optimization, since the magnitude of the variable is not limited, the coefficient serving as the variable (parameter) becomes infinitely large when minimizing the objective function. As the variable becomes larger, the possibility of overfitting generally increases, and correction errors of unmeasured regions increase.

To prevent this, this embodiment uses the regularized regression model. More specifically, as represented by equation (3) below, the regularized regression model is obtained by adding a regularization term with a model variable as a function to the loss function as a general regression model without regularization. In equation (3), the regularization term includes the monotonically increasing function of variables.

$$\underbrace{\sum_{i=1}^{n}(Y_i - T_i)^2}_{loss\ function} + \underbrace{f(k_1, k_3, k_5, k_7, k_9, k_{11})}_{regularization\ term} \qquad (3)$$

By providing the regularization term in the objective function as described above, a penalty is given to the larger variable. Thus, it is possible to suppress (prevent) the excessively large variable. In other words, overfitting can be suppressed in the objective function including the loss function and the regularization term.

An arbitrary monotonically increasing function of variables can be set as the regularization term. This embodiment will be described assuming that the regularization term includes an Lp norm of the variable vector, particularly, an L1 norm with p=1. Note that the regularization term is not limited to an L1 norm with p=1. For example, the regularization term can include the L2 norm with p=2. Further, the regularization term can include an Lp norm with p as an arbitrary number. Equations (4) below represent the Lp norm, the L1 norm, and the L2 norm. In equations (4), D is the number of variables to be used, and k is the value of each variable.

Lp norm: $\|k\|_p = (\Sigma_{d=1}^{D} |k_d|^p)^{1/p}$

L1 norm: $\|k\|_1 = (\Sigma_{d=1}^{D} |k_d|)$

L2 norm: $\|K\|_2 = (\Sigma_{d=1}^{D} (k_d)^2)^{1/2}$ \qquad (4)

The variable regularization effect depends on the type of norm. For the L1 norm, due to its nature, unnecessary coefficients tend to drop to zero, but the coefficients tend to be sparse.

Figure 6A:
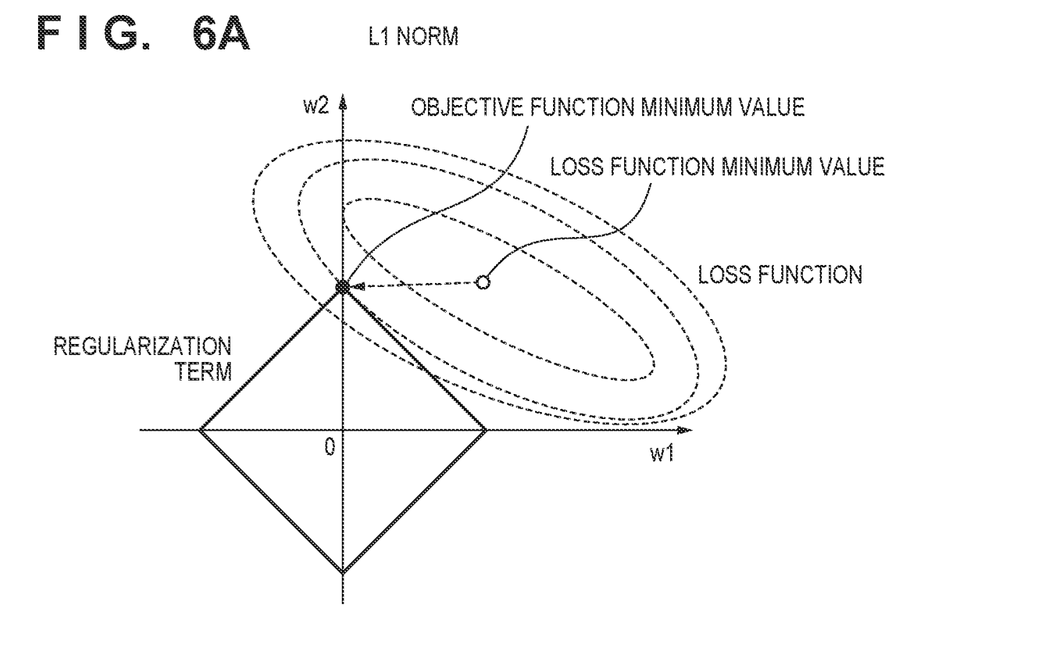
FIGS. 6A and 6B are views for explaining the reason why an L1 norm tends to give a sparse result.
Figure 6B:
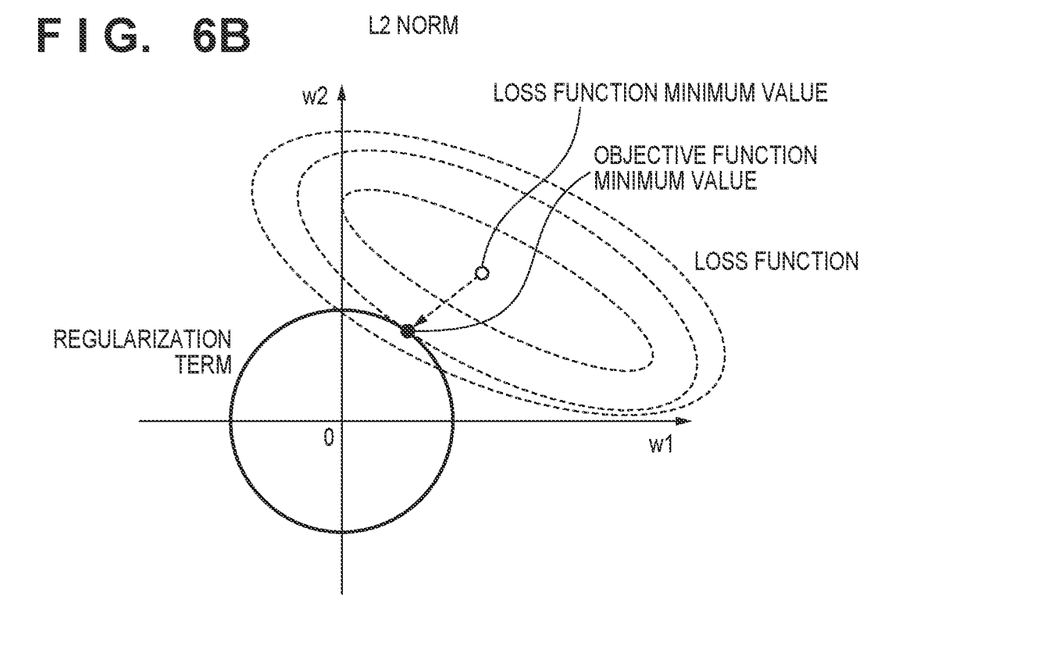

With reference to FIGS. 6A and 6B, the reason why the L1 norm tends to give a sparse result will be explained in comparison with the L2 norm. The L1 norm uses the sum of the absolute values of the coefficients of the model as a penalty. The L2 norm uses the sum of the squares of the coefficients of the model as a penalty. Both the L1 norm and the L2 norm are regularized regression models in which the penalty is smaller as the coefficient is smaller. However, the problem of minimizing the objective function including the norm is replaced with the problem of searching for a solution that minimizes the loss function within the range defined by the norm. Since the defined range is different between the L1 norm and the L2 norm, the optimal solution is also different between the L1 norm and the L2 norm. As shown in FIG. 6B, in the L2 norm, the range defined for each model variable (two variables) has a circular shape. Hence, the optimum solution within this range tends to be the result obtained by proportional reduction of the optical solution in a case of using no regularization term (using only the loss function). On the other hand, in the L1 norm, as shown in FIG. 6A, the range defined for each model variable has a shape with edges. Hence, the optimum solution tends to have one coefficient of 0. Therefore, by using the objective function including the regression model and the L1 norm serving as the regularization term, it is possible to efficiently thin out unnecessary coefficients. Note that in FIGS. 6A and 6B, w1 and w2 correspond to the coefficients (for example, $k_1$ and $k_3$) included in the regression model.

Figure 7A:
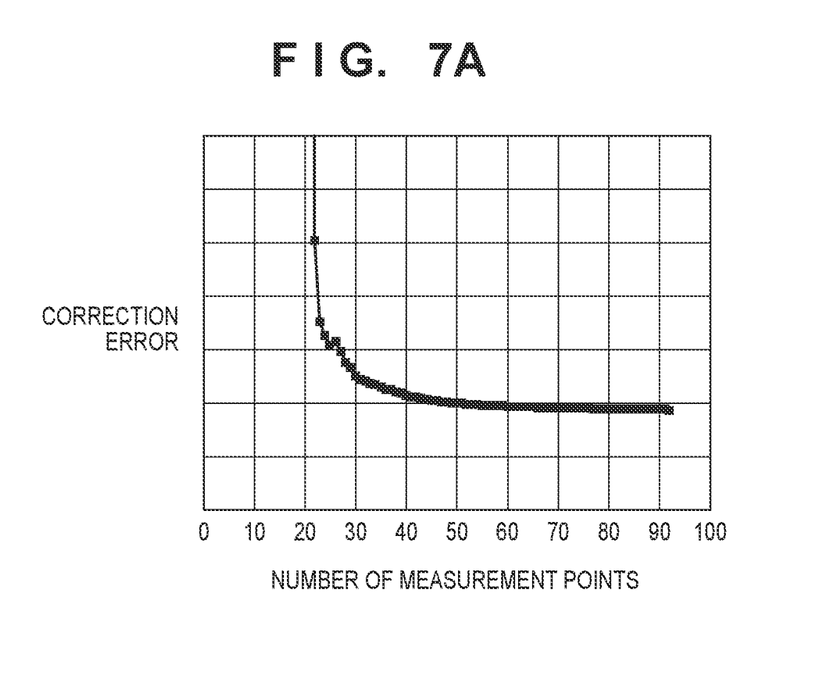
FIGS. 7A and 7B are views for explaining the effect of a regularized regression model including the L1 norm.
Figure 7B:
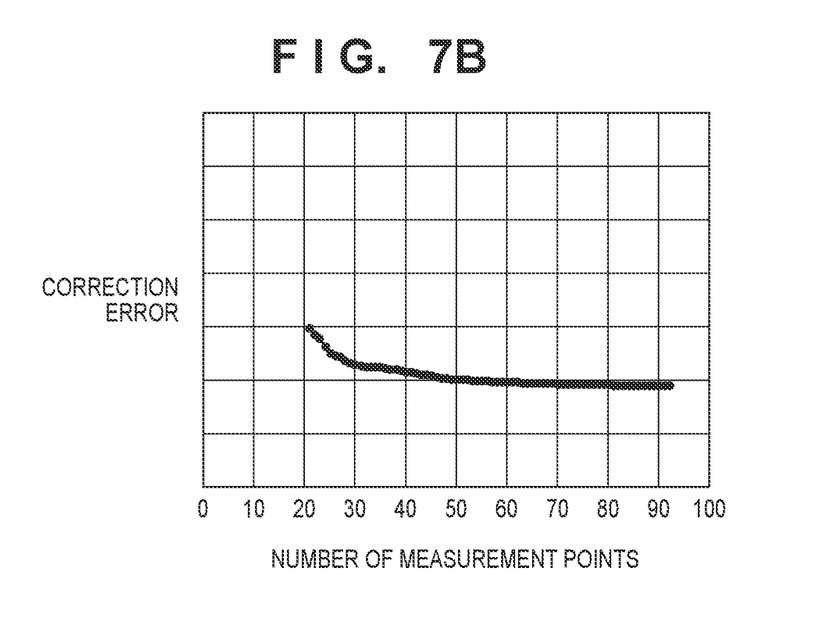

With reference to FIGS. 7A and 7B, the effect of the regularized regression model including the L1 norm will be described. FIG. 7A shows the relationship between the number of measurement points and the correction errors (correction residuals) of unmeasured regions in a case of using all assumed coefficients (models corresponding thereto) of the regression model. FIG. 7B shows the relationship between the number of measurement points and the correction errors (correction residuals) of unmeasured regions in a case of extracting, using an L1 norm as the regularization term, the coefficients of the regression model (this embodiment).

In the case of using all assumed coefficients of the regression model, as shown in FIG. 7A, as the number of measurement points decreases, overfitting starts from a certain number, and the correction errors sharply increase. On the other hand, in this embodiment, as shown in FIG. 7B, even if the number of measurement points decreases, the increase in correction errors is within a gradual change. This is because unnecessary coefficients (models corresponding thereto) are removed by regularized regression and only important coefficients are extracted, so that overfitting is suppressed even with the small number of measurement points.

In this embodiment, the example has been described in which the L1 norm is used as the regularization term, but the present invention is not limited to this. For example, an Lp norm or a linear combination of Lp norms may be used as the regularization term.

Figure 8:
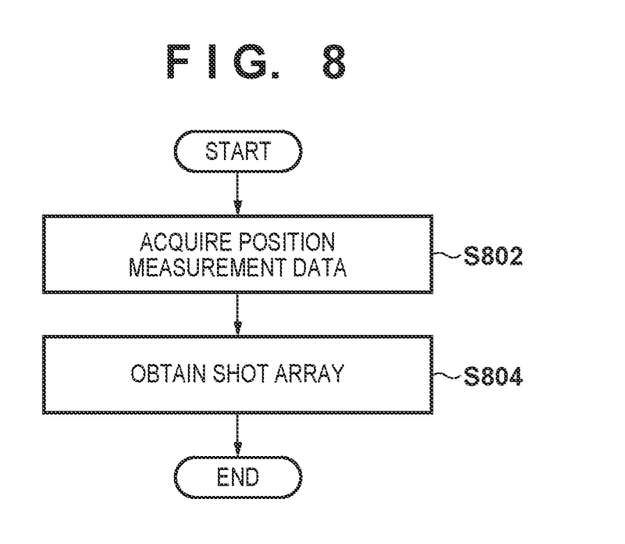
FIG. 8 is a flowchart for explaining processing of obtaining the shot array by using an objective function including a regression model and a regularization term.

As shown in FIG. 8, processing of obtaining a shot array by using an objective function including a regression model and a regularization term, that is, by using a regularized regression model without optimizing the regression model used to estimate the shot array on the substrate also constitutes one aspect of the present invention. In this case, in step S802, position measurement data is acquired using the substrate 4 as the substrate to be actually exposed. More specifically, the number of sample shot regions for the substrate 4 is set to be a relatively small number. Then, the alignment mark 12 assigned to each sample shot region on the substrate 4 is detected by the alignment optical system 7 to acquire position measurement data. In step S804, the shot array is obtained by applying the position measurement data acquired in step S802 to the regularized regression model, and calculating the value of each of a plurality of coefficients included in the regression model, with which the regularized regression model become equal to or smaller than a reference value, for example, the regularized regression model is minimized. In this manner, even in a case in which the regression model is not optimized, by including the regularization term, unnecessary coefficients (models corresponding thereto) can be made small. Accordingly, overfitting can be suppressed even with a small number of measurement points.

A method of manufacturing an article according to the embodiment of the present invention is suitable for manufacturing an article, for example, a liquid crystal display element, a semiconductor element, a flat panel display, or a MEMS. The manufacturing method includes a process of exposing, using the above-described exposure apparatus 1 or exposure method, a substrate to which a photoresist is applied, and a process of developing the exposed photoresist. In addition, an etching process, an ion implantation process, and the like are performed for the substrate using the pattern of the developed photoresist as a mask, thereby forming a circuit pattern on the substrate. By repeating the processes of exposure, development, etching, and the like, a circuit pattern formed by a plurality of layers is formed on the substrate. In the post-process, dicing (processing) is performed for the substrate on which the circuit pattern is formed, and chip mounting, bonding, and inspection processes are performed. The manufacturing method can also include other known processes (for example, oxidation, deposition, vapor deposition, doping, planarization, and resist removal). The method of manufacturing an article according to this embodiment is advantageous in at least one of the performance, quality, productivity, and production cost of the article, as compared to conventional methods.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-163069 filed on Oct. 1, 2021, which is hereby incorporated by reference herein in its entirety.

What is claimed is:

1. A method of obtaining an array of a plurality of regions on a substrate, comprising:
    calculating, using an objective function, which includes a loss function which includes, as variables, a plurality of coefficients included in a regression model used to estimate the array and obtains the plurality of coefficients, and a regularization term used to limit values of the plurality of coefficients, and position measurement data of a mark assigned to a sample region among a plurality of regions on a first substrate, the plurality of coefficients included in the regression model, with which the objective function becomes not more than a reference value;
    extracting, a coefficient not less than a threshold value from the plurality of coefficients calculated in the calculating; and
    obtaining, using a regression model including only the coefficient extracted in the extracting and position measurement data of a mark assigned to a sample region among a plurality of regions on a second substrate, an array of the plurality of regions on the second substrate.

2. The method according to claim 1, wherein in the calculating, the plurality of coefficients included in the regression model, with which the objective function is minimized, is calculated.

3. The method according to claim 1, wherein the number of sample regions on the second substrate is smaller than the number of sample regions on the first substrate.

4. The method according to claim 1, wherein the first substrate and the second substrate are different substrates.

5. The method according to claim 1, wherein the first substrate and the second substrate are the same substrate.

6. The method according to claim 1, wherein the regularization term includes an Lp norm.

7. The method according to claim 6, wherein the Lp norm includes one of an L1 norm and an L2 norm.

8. The method according to claim 1, wherein the regression model includes a polynomial model that includes a position of the substrate as a variable.

9. An exposure method of exposing a substrate via an original, comprising:
    obtaining an array of a plurality of regions on the substrate using a method defined in claim 1; and
    transferring a pattern of the original to each of the plurality of regions while positioning the substrate based on the array obtained in the obtaining.

10. A method of manufacturing an article, comprising:
    exposing a substrate using an exposure method defined in claim 9;
    developing the exposed substrate; and
    manufacturing the article from the developed substrate.

11. An information processing apparatus executing a method defined in claim 1.

12. An exposure apparatus for exposing a substrate via an original, comprising:
    a processing unit configured to obtain an array of a plurality of regions on the substrate; and
    a stage configured to position the substrate based on the array obtained by the processing unit,
    wherein the processing unit:
        calculates, using an objective function, which includes a loss function which includes, as variables, a plurality of coefficients included in a regression model used to estimate the array and obtains the plurality of coefficients and a regularization term used to limit values of the plurality of coefficients, and position measurement data of a mark assigned to a sample region among a plurality of regions on a first substrate, the plurality of coefficients included in the regression model, with which the objective function becomes not more than a reference value,
        extracts a coefficient not less than a threshold value from the plurality of coefficients calculated in the calculating, and
        obtains, using a regression model including only the extracted coefficient and position measurement data of a mark assigned to a sample region among a plurality of regions on a second substrate, an array of the plurality of regions on the second substrate.

13. A non-transitory computer-readable storage medium storing a program configured to cause a computer to execute a method of obtaining an array of a plurality of regions on a substrate, the program causing the computer to execute:
    calculating, using an objective function, which includes a loss function which includes, as variables, a plurality of coefficients included in a regression model used to estimate the array and obtains the plurality of coefficients, and position measurement data of a mark assigned to a sample region among a plurality of regions on a first substrate, the plurality of coefficients included in the regression model, with which the objective function becomes not more than a reference value;
    extracting, a coefficient having the value not less than a threshold value from the plurality of coefficients calculated in the calculating; and
    obtaining, using a regression model including only the coefficient extracted in the extracting and position measurement data of a mark assigned to a sample region among a plurality of regions on a second substrate, an array of the plurality of regions on the second substrate.

* * * * *